(12) United States Patent
Wang et al.

(10) Patent No.: US 9,087,593 B2
(45) Date of Patent: *Jul. 21, 2015

(54) RANDOM BIT GENERATOR THAT APPLIES ALTERNATING CURRENT (AC) TO MAGNETIC TUNNEL JUNCTION TO GENERATE A RANDOM BIT

(71) Applicant: Seagate Technology LLC, Cupertino, CA (US)

(72) Inventors: Xiaobin Wang, Chanhassen, MN (US); Wenzhong Zhu, Apple Valley, MN (US); Henry Huang, Apple Valley, MN (US); Yiran Chen, Eden Prairie, MN (US); Haiwen Xi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 13/947,810

(22) Filed: Jul. 22, 2013

(65) Prior Publication Data

US 2014/0022837 A1    Jan. 23, 2014

Related U.S. Application Data

(63) Continuation of application No. 12/399,127, filed on Mar. 6, 2009, now Pat. No. 8,495,118.

(60) Provisional application No. 61/109,586, filed on Oct. 30, 2008.

(51) Int. Cl.
*G06F 7/58* (2006.01)
*G11C 11/16* (2006.01)
*G01R 33/09* (2006.01)

(52) U.S. Cl.
CPC .......... *G11C 11/1675* (2013.01); *G01R 33/098* (2013.01); *G06F 7/588* (2013.01)

(58) Field of Classification Search
USPC .............. 708/3, 209–210, 250, 255; 365/158, 365/171, 173
See application file for complete search history.

(56) References Cited

U.S. PATENT DOCUMENTS

| | | | |
|---|---|---|---|
| 6,195,669 B1 * | 2/2001 | Onodera et al. | 708/3 |
| 6,925,002 B2 | 8/2005 | Schwarzl | |
| 7,007,060 B2 * | 2/2006 | Miller, Jr. | 708/801 |
| 7,067,331 B2 * | 6/2006 | Slaughter et al. | 438/3 |
| 7,068,536 B2 | 6/2006 | Matsutera | |

(Continued)

OTHER PUBLICATIONS

Jun, "The Intel Random Number Generator", Cryptography Research, Inc., Apr. 1999.

(Continued)

*Primary Examiner* — Tammara Peyton
(74) *Attorney, Agent, or Firm* — Cesari & Reed LLP; Kirk A. Cesari; David K. Lucente

(57) ABSTRACT

Devices and methods for generating a random number that utilizes a magnetic tunnel junction are disclosed. An AC current source can be in electrical connection to a magnetic tunnel junction to provide an AC current to the magnetic tunnel junction. A read circuit can be used to determine a bit based on a state of the magnetic tunnel junction. A rate of production of the bits can be adjusted, such as by adjusting a frequency or amplitude of the AC current. A probability of obtaining a "0" or "1" bit can be managed, such as by an addition of DC biasing to the AC current.

17 Claims, 2 Drawing Sheets

(56) References Cited

U.S. PATENT DOCUMENTS

| | | | |
|---|---|---|---|
| 7,099,906 B2* | 8/2006 | Messina et al. | 708/255 |
| 7,224,601 B2* | 5/2007 | Panchula | 365/158 |
| 7,284,024 B1 | 10/2007 | Trifonov | |
| 7,333,360 B2* | 2/2008 | DeHerrera et al. | 365/173 |
| 7,405,423 B2 | 7/2008 | Tanamoto | |
| 7,486,545 B2 | 2/2009 | Min | |
| 7,616,412 B2 | 11/2009 | Zhu | |
| 7,634,522 B1* | 12/2009 | Carter et al. | 708/250 |
| 7,702,701 B2* | 4/2010 | Kim | 708/3 |
| 7,800,938 B2 | 9/2010 | Rivkin | |
| 8,120,947 B2 | 2/2012 | Wang | |
| 8,595,274 B2* | 11/2013 | Pradhan et al. | 708/250 |
| 2008/0007991 A1 | 1/2008 | Diteweg | |
| 2008/0121726 A1 | 5/2008 | Brady | |
| 2010/0219492 A1* | 9/2010 | Roiz Wilson | 257/421 |

OTHER PUBLICATIONS

Lehmann, "Surmounting Oscillating Barriers", Physical Review Letters, vol. 84, No. 8, pp. 1639-1642 (Feb. 2000).

Wang, "Thermal Reversal of Magnetic Grains Under Time Varying Pulse Field", IEEE Transactions on Magnetics, vol. 42, No. 10, pp. 2294-2296 (Oct. 2006).

Wang, "Magnetization Lofarithmic Susceptibility, Damping, Parameter, and dynamics Symmetry Extraction", Applied Physics Letters, vol. 93, No. 182506 (2008).

* cited by examiner

RANDOM BIT GENERATOR THAT APPLIES ALTERNATING CURRENT (AC) TO MAGNETIC TUNNEL JUNCTION TO GENERATE A RANDOM BIT

CROSS REFERENCE TO RELATED APPLICATIONS

This application claims priority to U.S. patent application Ser. No. 12/399,127, filed on Mar. 6, 2009 and titled "Tunable Random Bit Generator with Magnetic Tunnel Junction", which claimed priority to U.S. Provisional Patent Application No. 61/109,586, filed on Oct. 30, 2008 and titled "Tunable Random Bits Generator Through AC Current Excited Magnetic Tunnel Junction", the entire contents of both are hereby incorporated by reference in their entirety.

BACKGROUND

Because of the desire to be able to communicate in a secure manner, computers have some internal system for generating encryption keys. These encryption keys are typically random "0" and "1" numbers and are generated by a "random number generator" (RNG). The randomness of the "0" and "1" numbers is designed to be completely unpredictable, including to those who know how the random number generator is designed. A "true random number generator" (TRNG) uses a non-deterministic source to produce the randomness. Many TRNGs operate by measuring unpredictable natural processes, such as thermal noise, atmospheric noise, or nuclear decay. A more recent technique for random number generation involves measuring quantum noise from an optical homodyne detection apparatus (e.g., a beam-splitter). Although this approach generates truly random bits, it is somewhat difficult to integrate on a chip.

There is always room for improvement in random number generating systems.

BRIEF SUMMARY

The present disclosure relates to apparatuses and methods of generating a random number by utilizing an AC current through a magnetic tunneling junction. The speed and probability of random "0" and "1" bits can be controlled by the frequency and amplitude of the AC current. The addition of DC biasing of the AC current can control the probability of obtaining a "0" or "1" bit.

In some embodiments, an apparatus can include a bit generator configured to generate data bits from an AC current excitable magnetic tunnel junction cell.

In other embodiments, an apparatus can include a random number generator having a magnetic tunnel junction cell, an AC current source connected to the magnetic tunnel junction cell and configured to provide AC current to the magnetic tunnel junction cell, and an output circuit configured to determine a state of the magnetic tunnel junction cell and provide a bit value based on the state.

In yet other embodiments, a method including generating a data bit by: passing an AC current through a magnetic tunnel junction cell, determining a state of the magnetic tunnel junction cell, and providing a data bit based on the state.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure provides a random bit generator (RBG) device configured to generate random "0" and "1" bits using an AC current excited magnetic tunneling junction cell. The AC current induces thermal magnetization switching of the free layer of a magnetic tunneling junction cell. The speed and probability of random "0" and "1" bits can be controlled by altering the frequency and amplitude of the AC current. Additionally, addition of a biased DC pulse can be used to adjust the probability of the random "0" and "1" bits.

In the following description, reference is made to the accompanying set of drawings that form a part hereof and in which are shown by way of illustration at least one specific embodiment. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure will be gained through a discussion of the examples provided below.

Figure 1:
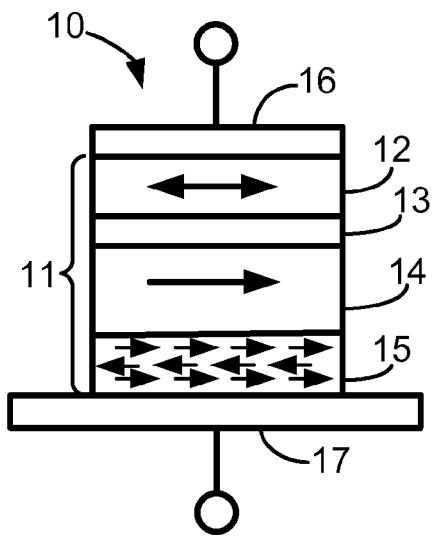
FIG. 1 is a cross-sectional schematic diagram of an illustrative magnetic tunnel junction cell.

FIG. 1 is a cross-sectional schematic diagram of an illustrative magnetic tunnel junction cell. Magnetic tunnel junction cell 10 includes magnetic tunnel junction element 11 composed of a ferromagnetic free layer 12 and a ferromagnetic reference (i.e., pinned) layer 14. Free layer 12 and pinned reference layer 14 are separated by a non-magnetic spacer layer 13. Proximate pinned reference layer 14 is an antiferromagnetic (AFM) pinning layer 15, which pins the magnetization orientation of pinned reference layer 14 by exchange bias with the antiferromagnetically ordered material of pinning layer 15. Examples of suitable pinning materials include PtMn, IrMn, and others. Note that other layers, such as seed or capping layers, are not depicted for clarity.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and pinned reference layer 14 may be either a single layer or a synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Free layer 12 may be a synthetic ferromagnetic coupled structure, i.e., two ferromagnetic sublayers separated by a metallic spacer, such as Ru or Ta, with the magnetization orientations of the sublayers in parallel directions. Either or both layers 12, 14 are often about 0.1-10 nm thick, depending on the material and the desired resistance and switchability of free layer 12.

Non-magnetic spacer layer 13 is an insulating barrier layer sufficiently thin to allow tunneling of charge carriers between pinned reference layer 14 and free layer 12. Examples of suitable electrically insulating material include oxides material (e.g., $Al_2O_3$, $TiO_x$ or $MgO_x$). Non-magnetic spacer layer 13 could optionally be patterned with free layer 12 or with pinned reference layer 14, depending on process feasibility and device reliability.

The resistance and thus data state of magnetic tunnel junction cell 10 is determined by the relative orientation of the magnetization orientations of ferromagnetic layers 12, 14. The magnetization direction of pinned reference layer 14 is pinned in a predetermined direction by pinning layer 15 while the magnetization direction of free layer 12 is free to rotate. In FIG. 1, the magnetization orientation of free layer 12 is illustrated as undefined. In some embodiments, magnetic tunnel junction cell 10 is in the low resistance state where the magnetization orientation of free layer 12 is in the same direction or parallel to the magnetization orientation of pinned reference layer 14. In other embodiments, magnetic tunnel junction cell 10 is in the high resistance state where the magnetization orientation of free layer 12 is in the opposite direction or anti-parallel to the magnetization orientation of pinned reference layer 14. In some embodiments, the low resistance state represents a "0" data bit and the high resistance state represents a "1" data bit, whereas in other embodiments, the low resistance state represents a "1" data bit and the high resistance state represents a "0" data bit.

Switching the resistance state and hence the bit state of magnetic tunnel junction cell 10 occurs when the spin torque induced magnetization motion energy within cell 10 is sufficiently high for random thermal fluctuations to overcome the energy barrier between the two resistance states. The ability to switch the magnetization orientation between the two directions (i.e., parallel and antiparallel) is determined by the exponential of the energy barrier. To switch the magnetization direction of free layer 12 relative to reference layer 14, layer 12 must have magnetization motion with sufficient energy to overcome the energy barrier between the two states. In some embodiments, switching occurs via spin-transfer when a current, under the influence of a magnetic layer of magnetic tunnel junction cell 10, becomes spin polarized and imparts a spin torque on free layer 12 of magnetic tunnel junction cell 10. When a sufficient level of polarized current and therefore spin torque is applied to free layer 12, the magnetization orientation of free layer 12 can be changed among different directions and accordingly, magnetic tunnel junction cell 10 can be switched between the parallel state and the anti-parallel state. Switching may additionally or alternately occur due to thermal fluctuations caused by a low level AC current passing through magnetic tunnel junction cell 10. In these instances, the AC current may not be sufficiently strong to initiate spin-transfer by itself but is sufficiently strong to produce magnetization motion that has energy high enough for thermal fluctuations to switch magnetization state within free layer 12. In this case, deterministic polarized current and random thermal fluctuation together cause magnetization switching. For the random number generator device of this disclosure, the random switching of free layer 12 magnetization orientation is due to environmental thermal fluctuations together with thermal fluctuations caused by AC current excitation.

Figure 2:
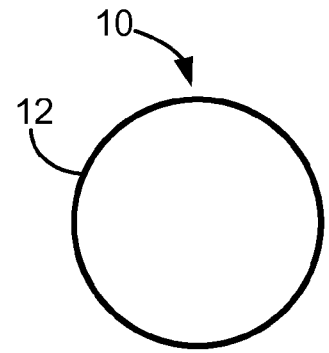
FIG. 2 is a top view of the magnetic tunnel junction cell of FIG. 1.

In the embodiment illustrated in FIG. 2, magnetic tunnel junction cell 10, particularly free layer 12, is circular, essentially circular or nearly circular. By the term "circular, essentially circular or nearly circular", what is intended is that free layer 12 has a diameter that varies no more than 10% around the shape of the free layer, in some embodiments no more than 5%. Additionally, a "circular, essentially circular or nearly circular" has an aspect ratio of two perpendicular or orthogonal axis of 0.9 to 1.1, in some embodiments 0.95 to 1.05. With a circular, essentially circular or nearly circular shape, the two magnetization orientations of free layer 12 and cell 10 are much less stable than for elliptical, oval or other shapes that have a definite major and minor axis or dimension. A circular, essentially circular or nearly circular free layer 12 has an easy axis and a hard axis, but has a stable energy much less than elliptic, oval or other shapes. With a circular free layer 12, the energy barrier necessary to overcome in order to switch the magnetization orientation (e.g., about 5 $K_bT$) is much less than for an elliptical or oval shape (e.g., about 80 $K_bT$). For a circular, essentially circular or nearly circular free layer 12, thermal fluctuations together with a low level AC current passing through circular free layer 12 can cross the energy barrier and switch the magnetization orientation.

Returning to FIG. 1, cell 10 has, electrically connected to element 11, a first or top electrode 16 and a second or bottom electrode 17. It is to be understood that the designations "top" and "bottom" are not to be limiting in their spatial relationship, but are merely used to facilitate understanding of the figures. In the following discussion, the term "top" is interchangeable with "first" and "bottom" is interchangeable with "second". First electrode 16 is in electrical contact with ferromagnetic free layer 12 and second electrode 17 is in electrical contact with ferromagnetic pinned reference layer 14 via pinning layer 15. Electrodes 16, 17 electrically connect element 11 to an AC source to provide current through layers 12, 14. Electrodes 16, 17 also electrically connect element 11 to a circuit to read the resistance state (i.e., high resistance state or low resistance state) of cell 10. Examples of materials for electrodes 16, 17 are conducting metal materials; suitable materials include TiN, TaN and Cu.

The illustrative magnetic tunnel junction cell 10 is used to construct a random number generator device where a "0" or "1" data bit is produced based on the relative magnetization state of free layer 12 with respect to pinned reference layer 14. The data bit can be read out by measuring the resistance of cell 10 which changes with the magnetization direction of free layer 12 relative to pinned reference layer 14.

To form a random number generator device, magnetic tunnel junction cell 10 is electrically connected to an AC current source to provide an AC current to be passed through cell 10 in a direction perpendicular to the stack of layers (i.e., free layer 12, reference layer 14, etc.). The thermal fluctuations together with the AC current provide energy sufficiently large to overcome the energy barrier and switch the magnetization orientation between two preferred magnetization directions.

Figure 3:
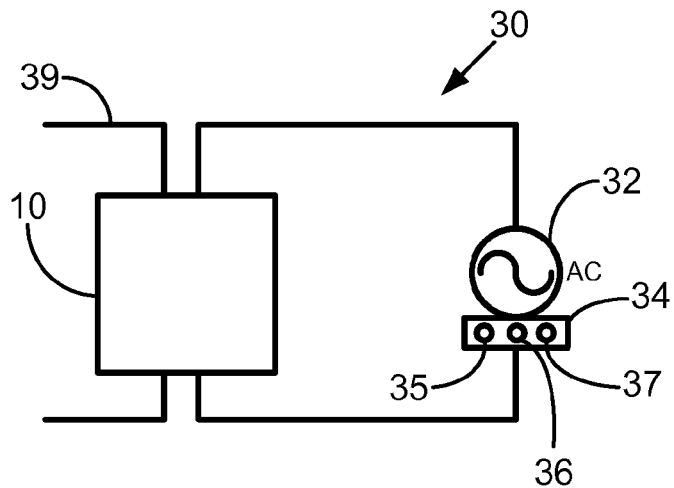
FIG. 3 is a schematic diagram of a random number generator including a magnetic tunnel junction cell and an AC power source.

Referring to FIG. 3, random number generator (RNG) device 30 has magnetic tunnel junction cell 10 connected to an AC current source 32.

AC current source 32 is configured to provide AC current having an amplitude approximate to, but less than, the critical switching current of free layer 12 of magnetic tunnel junction cell 10. That is, the AC current supplied by AC current source 32 is not sufficiently strong to initiate spin-transfer and switching of the magnetization of free layer 12 by itself, but is sufficiently strong to excite magnetization motion that has energy high enough for thermal fluctuations within free layer 12 to switch the magnetization orientation. At a finite temperature (e.g., about 25-30° C., which is approximately room temperature), the magnetization orientation of free layer 12 will switch randomly between the two preferred directions (i.e., parallel or antiparallel to the magnetization orientation of pinned layer 14) due to a combination of random thermal fluctuation and AC spin torque current excitation. In some embodiments, a temperature fluctuation of less than 0.1° C. may be sufficient to switch the magnetization orientation of free layer 12. At lower temperatures, e.g., about 0-10° C., the magnetization orientation of free layer 12 will switch less readily due to temperature fluctuations, thus, a higher frequency and/or amplitude of the AC current will be needed. Oppositely, at higher temperatures, e.g., about 90° C., the magnetization orientation of free layer 12 will switch very readily due to environmental thermal fluctuations.

Figure 4:
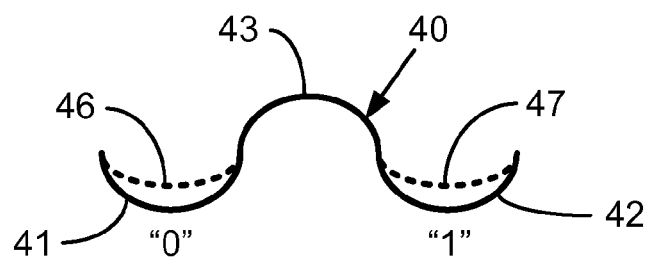
FIG. 4 is an energy barrier diagram.

FIG. 4 shows an illustrative energy barrier 40 for a circular magnetic tunnel junction (e.g., magnetic tunnel junction 10) that has a switchable magnetization. Barrier 40 has a first well 41 that represents the "0" bit energy state and a second well 42 that represents the "1" bit energy state. To move from one well to the other, the energy barrier peak 43 must be overcome. With the addition of an AC current through the magnetic tunnel junction that imparts some spin torque, the energy barrier for each of the energy states "0" and "1" is increased, from energy well 41 to energy well 46 for the "0" bit and from energy well 42 to energy well 47 for the "1" bit. With the spin torque due to the AC current, the energy change needed, e.g., from energy well 46 to peak 43 or from energy well 47 to peak 43, is less than that from energy well 41 to peak 43 and from energy well 42 to peak 43, resulting in an easier barrier to overcome in order to switch from "0" to "1" and vice versa. These increased energy wells, 46, 47 may be referred to as spin torque induced magnetic motion energy levels, or the like. Various features of the AC current will affect the spin torque induced magnetic motion energy levels 46, 47.

Returning to FIG. 3, AC current source 32 has a controller module 34, which can adjust the amplitude and the frequency of the AC current; in the embodiment illustrated in FIG. 3, controller module 34 has a first adjuster 35, such as a knob, for adjustment of the current amplitude and a second adjuster 36, such as a know, for adjustment of the current frequency. Additionally, controller module 34 can include a DC pulse feature, controllable by third adjuster 37, such as a knob, which biases the AC current. Any or all of adjusters 35, 36, 37 may be an analog adjuster, such as a knob, a switch, a toggle, or may be digital adjusters, such as software or firmware within controller module 34. By utilizing any or all of the three adjustments, the rate of random bit generation and the probability of random bit generation can be tuned.

The speed at which random bits are generated can be controlled by adjusting either or both the current amplitude (via adjuster 35) and the current frequency (via adjuster 36) of the AC current. To increase the rate of random bit generation, the current amplitude (via adjuster 35) can be increased. Additionally or alternatively, the current frequency (via adjuster 36) can be decreased to increase the rate of random bit generation. To decrease the rate of bit generation, the opposite tuning is done. See, for example, "Magnetization logarithmic susceptibility, damping parameter, and dynamics symmetry extraction" in Applied Physics Letters, Vol. 93, 182506, by Wang et al., which discusses the susceptibility of magnetization switching as a function of current frequency. It has been found that both current frequency and amplitude have large effects on magnetization switching probability. To obtain more accurate control of the energy barrier peak, both the current amplitude and the current frequency can be tuned simultaneously. The tuning sensitivity of RNG device 30 is very high due to the exponential dependence of switching probability on the energy barrier.

RNG device 30 also includes reading circuitry 39, to read the resistance state (i.e., high resistance state or low resistance state) of cell 10 and provide the generated bit or number (i.e., "0" or "1").

Although the number or bit randomly generated by magnetic tunnel junction cell 10 cannot be controlled, the probability of either a "0" or "1" bit can be controlled. By biasing the AC current with the application of a DC pulse, each of the two magnetization motion energies (e.g., in FIG. 4, well 46 for state "0" and well 46 for state "1") excited by AC+DC polarized current can be shifted while the same magnitude of thermal fluctuations is maintained. For example, to increase the probability of one bit (e.g., "0") versus the other (e.g., "1") the DC current is biased to favor polarized-current excited magnetization motion energy in state "1" and suppress polarized-current excited magnetization motion energy in state "0".

The resulting random number generator device 30, while still producing random numbers (i.e., either a "0" or "1") can be tuned to produce the number at a faster or slower occurrence by controlling the amplitude and/or the frequency of the AC current through the magnetic tunnel junction cell. Additionally, random number generator device 30 can be tuned to modify the probability of either a "0" or "1" bit or number, while maintaining randomness, by controlling the biasing of the AC current by addition of a DC pulse.

The random thermal switching of the magnetization of the free layer of the magnetic tunnel junction between the two magnetization directions (parallel and antiparallel) is determined by the exponential of the energy barrier. The magnitude of the thermal energy barrier is affected by both AC current amplitude and frequency. Thus, tuning the amplitude and/or frequency of the AC current can effectively control the thermal energy barrier and thus effectively control thermal switching. Additionally, biasing the AC current by a DC pulse can effectively control the switching probability. The tuning sensitivity of the random number generator device is high due to the exponential dependence of switching probability on energy barrier.

Figure 5:
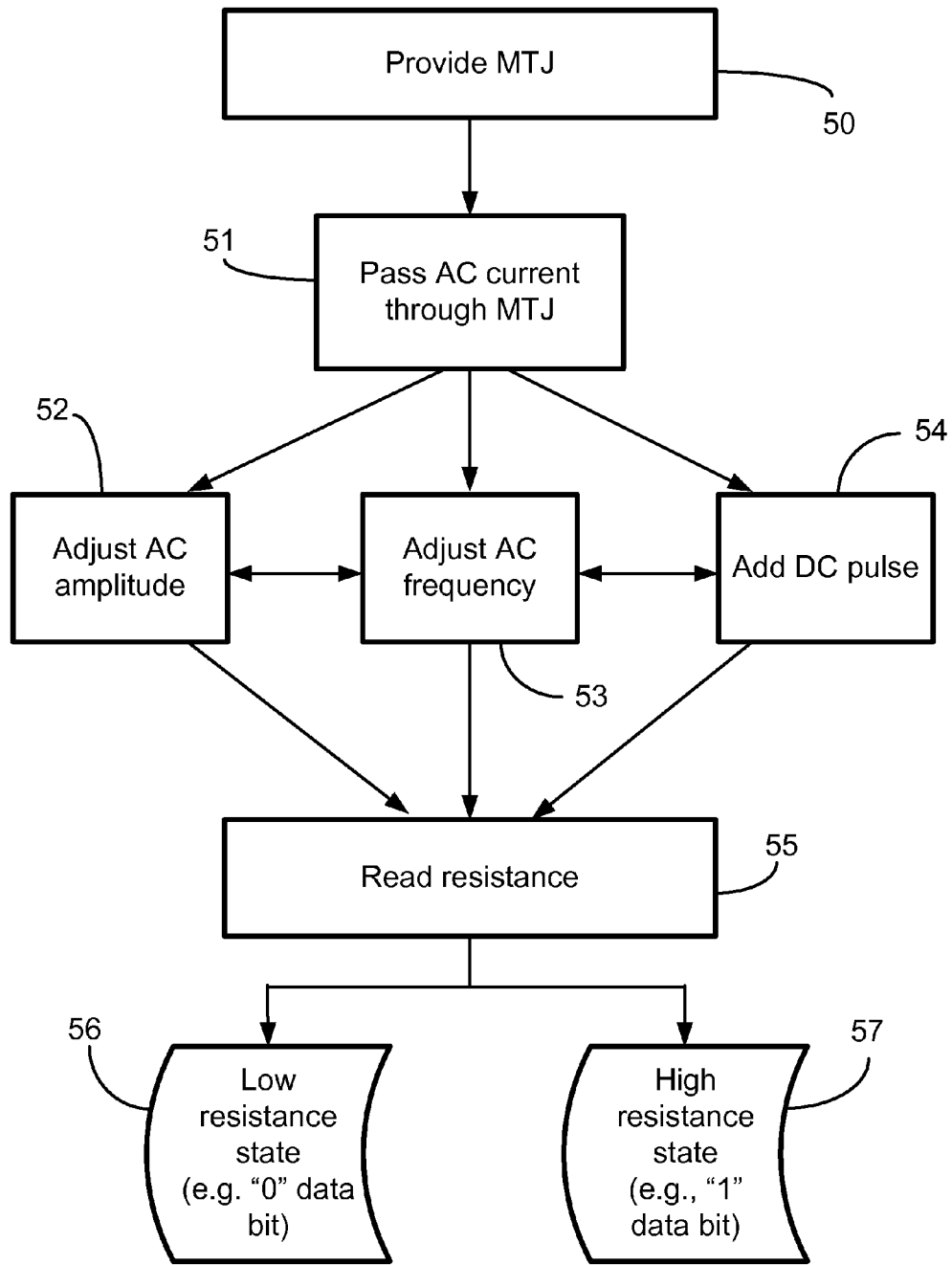
FIG. 5 is a flow diagram showing steps for generating a random number.

FIG. 5 illustrates an illustrative flow chart for generating a random number or bit. First, a magnetic tunnel junction is provided in step 50. An AC current is passed through the magnetic tunnel junction in step 51. The current may be adjusted in either or both its amplitude (step 52) or its frequency (step 53). A DC biasing pulse may be added in step 54. Steps 52, 53, 54 may be done in any order, including simultaneously. The resistance of the magnetic tunnel junction is read in step 55. This resistance results in a randomly generated data state, either a low resistance (step 56) or a high resistance (step 57).

Thus, embodiments of the TUNABLE RANDOM BIT GENERATOR WITH MAGNETIC TUNNEL JUNCTION are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An apparatus comprising:
    a bit generator configured to determine a data bit from a magnetic tunnel junction cell by applying an alternating current (AC) to the magnetic tunnel junction cell to generate a random bit; and
    a control module coupled to the bit generator and configured to control production of multiple random bits from the bit generator.

2. The apparatus of claim 1, further comprising the bit generator configured to determine the data bit based on a resistance state of a layer of the magnetic tunnel junction cell.

3. The apparatus of claim 2, further comprising the layer is a free layer and the AC switches a magnetization orientation of the free layer to generate the bit.

4. The apparatus of claim 1 further comprising:
    the control module configured to adjust an amplitude of the AC through the magnetic tunnel junction cell.

5. The apparatus of claim 1 further comprising:
    the control module configured to adjust a frequency of the AC through the magnetic tunnel junction cell.

6. The apparatus of claim 1 further comprising:
    the control module configured to adjust an amplitude and a frequency of the AC through the magnetic tunnel junction cell.

7. The apparatus of claim 1 further comprising:
    the control module configured to modify the probability of a specific bit occurring by controlling biasing of the AC.

8. The apparatus of claim 1 further comprising: the control module configured to control biasing of the AC by addition of a DC pulse.

9. The apparatus of claim 1 further comprising:
    the control module configured to control a rate of production of the multiple random bits determined from the bit generator via controlling the AC source.

10. The apparatus of claim 1 further comprising:
    the AC having an amplitude less than a critical switching current of a free layer of the magnetic tunnel junction cell.

11. The apparatus of claim 1 further comprising:
    the bit generator includes a reading circuit configured to read a resistance state of the magnetic tunnel junction cell and provide a bit value based on the resistance.

12. An apparatus comprising:
    a random number generator including:
        an input circuit adapted to provide a current to a magnetic tunnel junction cell;
        an output circuit configured to determine a state of the magnetic tunnel junction cell and provide a bit value based on the state; and
        a control module configured to control production of multiple bits from the magnetic tunnel junction cell.

13. The apparatus of claim 12 further comprising: a current source connected to the magnetic tunnel junction cell via the input circuit.

14. The apparatus of claim 13 further comprising: the control module configured to control the current source to vary a rate of production of the multiple bits from the magnetic tunnel junction cell.

15. A method comprising:
    generating a data bit by:
        passing a current through a magnetic tunnel junction cell;
        determining a state of the magnetic tunnel junction cell;
        providing a data bit based on the state;
    controlling production, via a controller module coupled to a source of the current, of multiple data bits from the magnetic tunnel junction cell; and
    producing a random number based on the multiple data bits.

16. The method of claim 15 further comprising generating an encryption key based on the random number.

17. The method of claim 15 further comprising adjusting a rate of production of the multiple data bits via the controller module.

* * * * *